United States Patent [19]

Marrs et al.

[11] Patent Number: 5,355,283
[45] Date of Patent: Oct. 11, 1994

[54] BALL GRID ARRAY WITH VIA INTERCONNECTION

[75] Inventors: Robert C. Marrs, Scottsdale, Ariz.; Tadashi Hirakawa, Osaka, Japan

[73] Assignees: Amkor Electronics, Inc., Paoli, Pa.; Teijin Limited, Osaka, Japan

[21] Appl. No.: 47,721

[22] Filed: Apr. 14, 1993

[51] Int. Cl.$^5$ .................... H05K 7/02; H01L 23/28
[52] U.S. Cl. .................... 361/760; 174/52.2; 174/260; 174/266; 174/52.4; 257/687; 257/787; 361/730; 361/736; 361/761; 361/777; 29/841
[58] Field of Search ............. 361/728, 730, 736, 760, 361/761, 765, 767, 777; 174/52.2, 52.4, 260, 262, 263, 264–266; 257/678, 684, 687, 693, 698, 701, 704, 774, 779, 786–788; 29/841, 848, 855, 856

[56] References Cited

U.S. PATENT DOCUMENTS

| | | | |
|---|---|---|---|
| 4,792,646 | 12/1988 | Enomoto | 29/851 |
| 5,136,366 | 8/1992 | Worp et al. | 361/760 |
| 5,153,385 | 10/1992 | Juskey et al. | 174/260 |
| 5,241,133 | 8/1993 | Mullen, III et al. | 174/52.4 |

FOREIGN PATENT DOCUMENTS 57-79652  5/1982  Japan .

Primary Examiner—Leo P. Picard
Assistant Examiner—Bot Ledynh
Attorney, Agent, or Firm—Skjerven, Morrill, MacPherson, Franklin & Friel

[57] ABSTRACT

A ball grid array is formed by mounting and electrically connecting one or more electronic devices to a substrate in which vias are formed to interconnect electrically conductive traces formed in a surface of the substrate to solder ball pads formed at an opposite surface of the substrate. The vias are formed by mechanical or laser drilling. Solder balls are formed on each of the pads and are reflow-attached to, for instance, a printed circuit board. The electronic components can include one or more integrated circuit chips, as well as passive components. The electronic components are attached to the substrate using wirebonding, TAB or flip chip connection. An encapsulating material is applied to encapsulate the electronic devices.

17 Claims, 3 Drawing Sheets

BALL GRID ARRAY WITH VIA INTERCONNECTION

CROSS-REFERENCE TO RELATED APPLICATION

This application is related to and incorporates by reference the U.S. patent application having Ser. No. 07/893,518, assigned to the same assignee as the present application, filed on Jun. 2, 1992, entitled "Integrated Circuit Package with Via Interconnection Techniques and Method for Forming Such a Package," by Robert C. Marrs and Tadashi Hirakawa.

BACKGROUND

1. Field of the Invention

This invention relates generally to integrated circuits and, more particularly, to a ball grid array in which one or more vias are formed through a substrate to electrically interconnect electrically conductive traces formed on a surface of the substrate to solder ball pads formed on another surface of the substrate.

2. Related Art

A ball grid array is a type of packaged integrated circuit in which one or more integrated circuit chips (semiconductor dice on which electrically conductive circuitry are formed) are mounted on a surface (top substrate surface) of a substrate, and electrical connection to electrically conductive material not part of the packaged integrated circuit, such as a printed circuit board, is made by an array of solder balls located on a surface of the substrate opposite the surface to which the integrated circuit chip or chips are attached (bottom substrate surface). Passive components such as resistors or capacitors can also be mounted on the top surface of the substrate. The substrate can be a multi-layer substrate, electrically conductive traces and/or regions being formed on a surface of each layer of the substrate, such as described in U.S. Pat. No. 4,975,761 to Chu. The integrated circuit chip or chips and the passive components are typically encapsulated by, for instance, plastic to protect the integrated circuit chip or chips and the passive components from the external environment. The integrated circuit chip or chips are electrically connected to the substrate by wirebonding, tape-automated bonding (TAB), or flip-chip interconnection. Ball grid arrays allow a high density of external chip connections to be made as compared to other packaged integrated circuits having leads extending from the package.

FIG. 1 is a cross-sectional view of a prior art ball grid array 100. An integrated circuit chip 101 is attached to a substrate 102. Electrically conductive bond wires 106 make electrical connection between selected ones of bond pads (not shown) formed on the chip 101 and electrically conductive traces 105 formed on the top surface 102a of the substrate 102. Encapsulant 103 is formed on the top surface of the substrate 102 to cover the chip 101, bond wires 106 and a portion of the traces 105. The traces 105 extend beyond the encapsulant 103 to through-holes 107 that are formed through substrate 102 to the bottom surface 102b of the substrate 102. The through-holes 107 are plated with electrically conductive material. Electrically conductive traces 109 formed on the bottom surface of the substrate 102 extend from the through-holes 107 to pads 108 on which solder balls 104 are formed.

In the conventional ball grid array 100, electrical connection between the top surface 102a and the bottom surface 102b of the substrate 102 is made by through-holes 103. To prevent the encapsulant 107 from flowing out from through-holes 107 during application of encapsulant 103, the through-holes 107 are located outside the region in which encapsulant 103 is formed.

Potential problems have been found in manufacturing ball grid arrays. First, because the through-holes 107 are located outside the encapsulant area, the substrate 102, and, thus, the ball grid array 100, cannot be made as small as desired. Second, the presence of the traces 105 on the top surface 102a creates a rough surface so that during the encapsulation process, a mold surface contacting top surface 102a is not flush with respect to the entire surface 102a, thus allowing encapsulant bleed or flash to form on surface 102a. Further, a good seal does not form at the interface between the traces 105 and the encapsulant 103 so that moisture and contaminants can enter the die area along this interface.

In some prior ball grid arrays, solder resist has been added over the surface 102a (including over the traces 105) to smooth the surface 102a and improve the seal between the encapsulant 103 and traces 105 in order to improve the above problems. However, this has caused other problems such as poor heat resistance and higher cost, and has not totally solved the encapsulant bleed/flash and moisture problems.

Additional problems have been encountered with the ball grid array 100. Since the through-holes 107 penetrate entirely through the substrate 102, the length of the through-holes 107 is large. This large length causes high stress in the plating formed in the through-holes 107, especially on the corners formed where the through-holes adjoin the top and bottom surfaces 102a and 102b, respectively.

Previously, through-holes 107 have been formed by mechanical drilling. When through-holes 107 are formed by mechanical drilling, the diameter of through-holes 107 cannot be made smaller than a certain size because of limitations on the size of the drill bits used to form the through-holes 107. As the drill bits get smaller, they are increasingly prone to breakage during drilling, making mechanical drilling impractical as a means to form through-holes 107 with very small diameters. Further, in mechanical drilling of through-holes 107, a minimum spacing between through-holes 107 must be maintained. If the spacing is too small, the material lying between an existing through-hole 107 and a through-hole 107 being drilled will deform due to the forces imparted by the drill bit. Thus, the density of through-holes 107 (and, thus, electrical interconnections within the substrate 102) is limited when the through-holes are formed by mechanical drilling. Additionally, the speed of through-hole 107 formation is limited when mechanical drilling is used since through-holes 107 can only be drilled one at a time.

SUMMARY OF THE INVENTION

According to the invention, a ball grid array is provided that is less expensive and smaller than previous ball grid arrays. The ball grid array according to the invention includes a substrate on which one or more integrated circuit chips (semiconductor dice on which electrically conductive circuitry is formed) are mounted. Passive components, such as resistors and capacitors, can also be mounted on the substrate. Bond wires connect bond pads on the integrated circuit chip or chips to electrically conductive traces formed on the surface (top surface) of the substrate to which the integrated circuit is mounted. Vias (small concave depressions in insulative material which connect a first conductive region to a second conductive region) are formed in the substrate at locations at which it is desired to make electrical interconnection between traces on the top surface of the substrate and pads formed on the surface (bottom surface) of the substrate opposite the surface on which the integrated circuit chip is mounted. If the substrate is a multilayer substrate, vias can also be formed in the multilayer substrate at locations at which it is desired to make electrical interconnection between electrically conductive traces and/or regions formed on various layers of the multilayer substrate. Electrically conductive material is deposited within the via to electrically connect the traces and/or regions on substrate layers to traces and/or regions on other substrate layers or to pads on the bottom surface of the substrate. The integrated circuit chip or chips and passive components are encapsulated with a resin by, for instance, molding or potting. Solder balls are formed on the pads on the bottom surface of the substrate. The finished package can be connected to, for instance, a printed circuit board by reflowing the solder balls to form an attachment to electrically conductive material not part of the ball grid array, e.g., traces on the surface of the printed circuit board.

According to the invention, vias can be formed by mechanical or laser drilling. Advantageously, a laser can be used to form vias spaced more closely together than possible with mechanical drilling so that greater via density is achieved. Thermal lasers, such as $CO_2$ lasers or Nd:YAG lasers, can be used to form vias in inorganic substrates. Thermal lasers emit laser energy that penetrates a material by heating the material to produce melting and evaporation.

It would be preferable to use organic material rather than inorganic material to form the dielectric layers of multilayered substrates because of the lower cost, superior dielectric properties and ease of laser beam penetration of organic material. However, the use of a thermal laser in forming vias in organic materials produces undesirable side effects including, but not limited to, dielectric degradation, charring and surface reflow, due to the heating of the material. Thus, a non-thermal laser, such as an excimer laser, is preferably used to form vias in organic substrates. If an organic substrate is used, the substrate can further include reinforcement fibers such as aramid fibers.

According to the invention, vias are formed so as to create a shorter path between the bond pads on the integrated circuit chip or chips, or passive components, and the pads on which solder balls are formed. The encapsulant covers all vias, and no vias are formed in the substrate at a location outside of the encapsulant. The vias are filled with encapsulant during molding of the encapsulant. Alternatively, the vias can be filled in prior to molding by screening epoxy into the vias.

Preferably, electroless gold plating is applied to conductive traces on the top surface of the substrate so that all traces outside the encapsulant area are eliminated, enabling flash-free molding.

To form vias, various methods of laser drilling can be used. These include a mask imaging technique, contact mask technique, and conformal mask technique. In the mask imaging technique, a mask held above the substrate allows laser energy to strike the substrate at locations at which it is desired to form vias. In the contact mask technique, a perforated mask is attached to the substrate, and a laser beam is applied, laser energy passing through the holes in the mask. In the conformal mask technique, a perforated mask is adhered to the substrate and holes drilled in a manner similar to the contact mask technique.

Ball grid arrays according to the invention are smaller and/or have higher interconnection density, and have greater electrical speed transmission than prior art ball grid arrays. Using vias instead of through-holes allows higher interconnection density to be achieved. In particular, by forming vias with a laser, small vias with a diameter less than 100 microns can be easily obtained. Shorter paths between the chip and the solder ball decrease the electrical signal transmission time, and significantly reduce parasitic electrical parameters such as inductance, capacitance, and resistance.

DETAILED DESCRIPTION OF THE DRAWINGS

Figure 1:
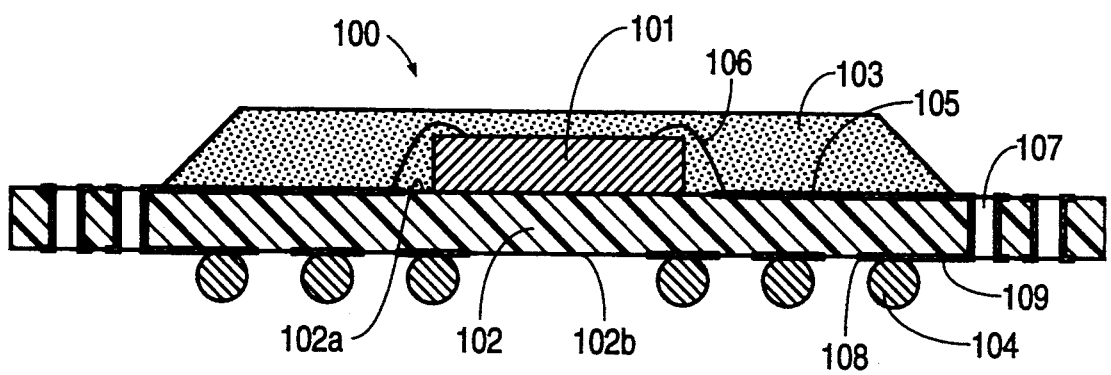
FIG. 1 is a cross-sectional view of a prior art ball grid array.
Figure 2:
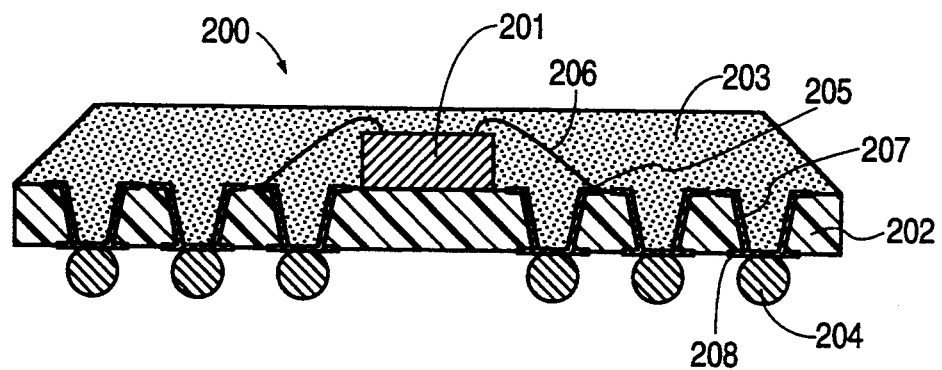
FIG. 2 is a cross-sectional view of a ball grid array according to the invention.

FIG. 2 is a cross-sectional view of a ball grid array 200 according to the invention. An integrated circuit chip 201 is mounted on a substrate 202. The substrate 202 may be a double-sided substrate (2-layer board) or multi-layer substrate. A plurality of bond pads (not shown) are formed on the integrated circuit chip 201. Selected ones of the bond pads are connected with electrically conductive bond wires 206 to electrically conductive traces 205 formed on the substrate 202. Alternatively, the integrated circuit chip 201 can be connected using flip-chip interconnection or tape automated bonding (TAB). The traces 205 extend to vias 207. Vias 207 are plated with electrically conductive material which makes electrical contact with traces 205. Electrically conductive pads 208 are formed at the bottom of vias 207 so that pads 208 are electrically connected to the plating in vias 207.

Encapsulant 203 encapsulates the integrated circuit chip 201 and fills in the vias 207. The encapsulant 203 may be a molding resin or a potting resin. No vias 207 are formed in substrate 202 outside of the encapsulant 203. Solder resist may be applied between the substrate 202 and the encapsulant 203.

Conventional solder balls 204 are formed, as is well known, on pads 208. Solder balls 204 are then connected to, for instance, a printed circuit board by reflowing the solder balls 204 to form an attachment to electrically conductive material not part of the ball grid array, e.g., traces on the surface of the printed circuit board.

Though only one integrated circuit chip 201 is shown in FIG. 2, it is to be understood that additional integrated circuit chips, as well as passive components such as resistors or capacitors, can also be mounted on substrate 202.

The vias 207 can be formed by, for instance, mechanical drilling, laser drilling, etching or chemical milling. If the vias 207 are formed by laser drilling, either a thermal or non-thermal laser is used. If the substrate 202 is formed of organic material, a non-thermal laser, such as an excimer laser, is advantageously used.

Vias 207 can be formed in the substrate 202 by laser drilling as described in detail in applicants' co-pending U.S. patent application Ser. No. 07/893,518, entitled "Integrated Circuit Package with Via Interconnection Techniques and Method for Forming Such a Package." Briefly, a laser energy source emits laser energy that is focused by a lens into a sheet-shaped laser beam. The laser beam is passed over the surface of a mask positioned above the surface of the substrate 202. The masking technique used can be mask imaging, contact masking or conformal masking, each of which is discussed in greater detail in applicants' above-referenced co-pending U.S. patent application. Laser energy passes through holes formed in the mask at locations at which it is desired to form vias 207 in the substrate 202, cutting through the substrate 202 to the pads 208 formed on the bottom surface of the substrate 202. The laser is tuned to a frequency which ensures that the substrate 202 material in the to-be-formed via 207 is ablatively removed. However the mask is of a material (such as copper) to which the laser is not tuned so that the mask is not ablatively affected by the laser.

The laser energy is allowed to penetrate through the substrate 202, but prevented from penetrating through the pads 208 (which are formed of metal) by controlling the fluence of the laser. Fluence represents a combination of the duration of time for which the laser energy is applied and the intensity of the laser during the period of application. Since the metallic material of the pads 208 is much denser than the material of which the substrate 202 is formed, the fluence may be controlled so that the laser operates at a sufficiently great strength for a sufficiently long time to penetrate the substrate 202, but not the pads 208.

In formation of vias through a multilayer substrate, the vias 207 can be formed after the layers have been laminated together, as described above, or the vias 207 can be formed in advance in one or more layers of the substrate 202 and then laminating the layers together.

Figure 3:
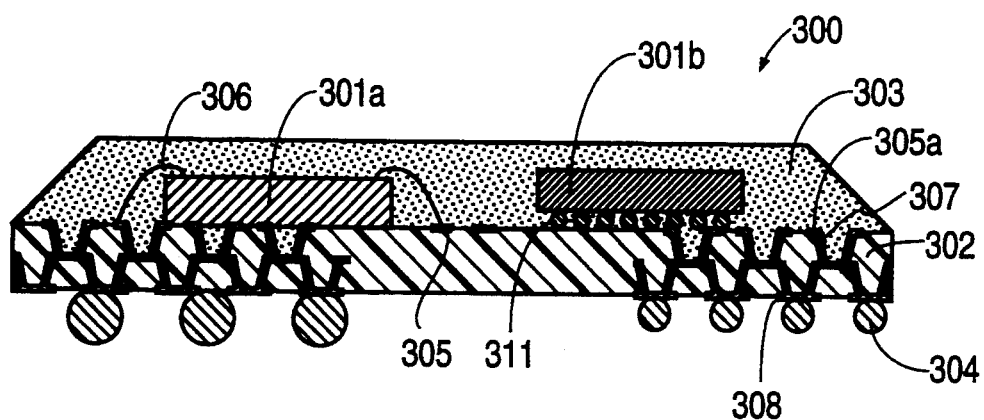
FIG. 3 is a cross-sectional view of a ball grid array according to another embodiment of the invention.

FIG. 3 is a cross-sectional view of a ball grid array 300 according to another embodiment of the invention. Integrated circuit chips 301a and 301b are attached to substrate 302. A plurality of bond pads (not shown) are formed on each of the integrated circuit chips 301a and 301b. Selected ones of the bond pads of the integrated circuit chip 301a are connected with electrically conductive bond wires 306 to electrically conductive traces 305 formed on the substrate 302. Electrically conductive bumps 311 are formed on selected ones of the bond pads of the integrated circuit chip 301b. Each of the bumps 311 is attached to an electrically conductive trace 305a formed on substrate 302 to form a conventional flip chip connection. The traces 305a extend to plated vias 307 which make electrical connection to between the traces 305a and electrically conductive pads 308 formed on the bottom surface of the substrate. Encapsulant 303 encapsulates the integrated circuit chips 301a and 301b and fills in the vias 307. Solder balls 304 are formed on each of the pads 308.

The substrate 302 is a multilayer substrate. Conductive traces and/or regions formed on each layer are connected to conductive traces and/or regions formed on other layers by vias. The vias are formed by a laser, as described above. To form the multilayer substrate 302 using a laser, a sequential lamination technique can be used, in which one layer is stacked on another layer on which electrically conductive regions and/or traces have already been formed and in which vias have already been formed. A prepreg is put on the substrate layers, and the layers are laminated using a vacuum press. The resin in the prepreg fills the vias as a result of resin flow during lamination.

Figure 4:
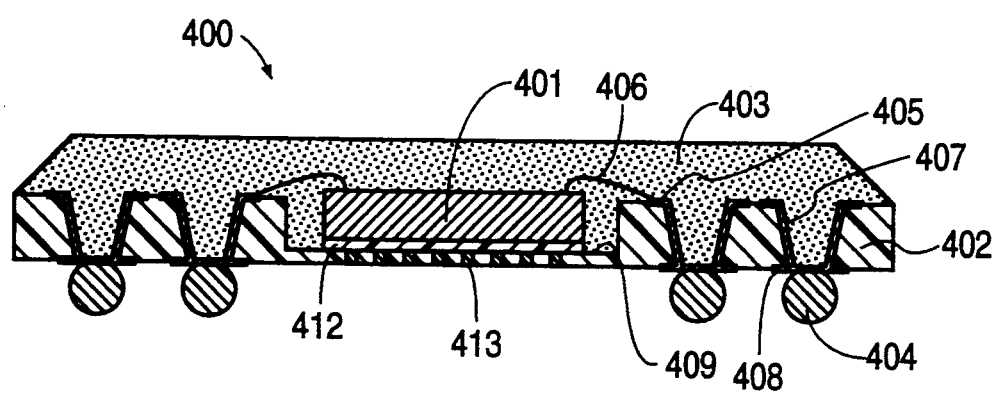
FIG. 4 is a cross-sectional view of a ball grid array according to another embodiment of the invention.

FIG. 4 is a cross-sectional view of a ball grid array 400 according to another embodiment of the invention, including an integrated circuit chip 401, a substrate 402, encapsulant 403 and bond wires 406. Ball grid array 400 is similar to ball grid array 100. Electrically conductive traces 405 are formed on a top surface of substrate 402. Plated vias 407 electrically connect traces 405 to pads 408 formed on the bottom surface of the substrate 402. Solder balls 404 are formed on each of the pads 408.

In ball grid array 400, a cavity 409 is formed in substrate 402. Integrated circuit chip 401 is attached in cavity 409 with a conventional die attach adhesive 412. Such an arrangement may be desirable as a means to supply ground and power plane voltages, provide heat dissipation from the chip, decrease the package profile, allow tighter grouping of integrated circuit chips and other components, or reduce the signal transmission length from the integrated circuit. The chip may be formed with a conductive underside that is electrically connected to a conductive cavity floor.

The cavity 409 can be formed with a laser using the methods described above. To form the cavity 409, the mask is patterned with larger openings than used to form vias 407. The use of a laser is preferable to accomplish this cavity formation because the laser overcomes the tolerance problems (e.g., cavity depth, corner radius, X-Y tolerance, damage to adjacent areas) associated with the previously used mechanical milling approach.

Additionally, in ball grid array 400, small vias 413 are formed through substrate 402 within cavity 409. The vias 413 are filled with, for instance, an epoxy resin. The presence of the vias 413 improves heat transfer from the chip 401 to the exterior of the ball grid array 400.

Figure 5:
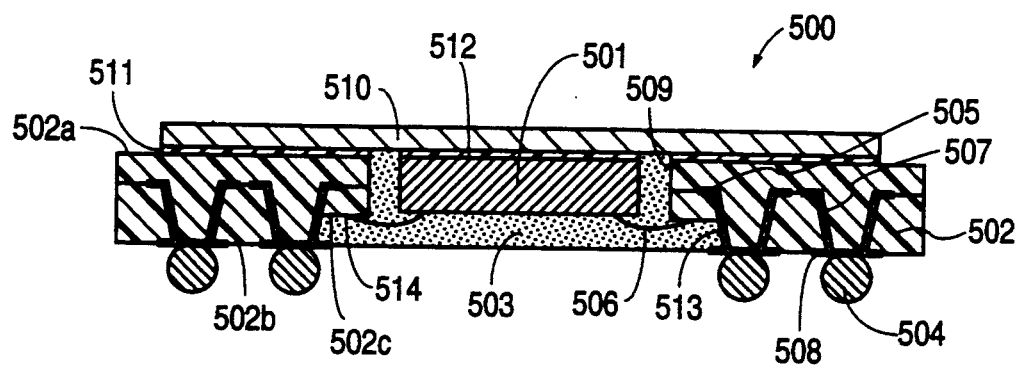
FIG. 5 is a cross-sectional view of a ball grid array according to another embodiment of the invention.

FIG. 5 is a cross-sectional view of a ball grid array 500 according to another embodiment of the invention. In ball grid array 500, a hole 509 is formed completely through the substrate 502 in a location corresponding to the location of the cavity 409 of ball grid array 400 (FIG. 4). A cavity 513 is formed adjacent hole 509 to create a surface 502c of substrate 502 that is recessed relative to surface 502b. The hole 509 and cavity 513 can be formed using the previously described laser techniques. An integrated circuit chip 501 is attached to a heat sink 510 with a conventional adhesive 512. The heat sink 510 can be formed of any material having an acceptably high thermal conductivity such as copper. The heat sink 510 is attached to a surface 502a of substrate 502 with an adhesive 511, such as an epoxy adhesive, such that integrated circuit chip 501 extends through the hole 509. Bond pads (not shown) on the integrated circuit chip 501 are connected with bond wires 506 to electrically conductive traces 514 formed on surface 502c. Electrically conductive traces 505 are also formed on an interior layer of substrate 502. Plated vias 507 electrically connect traces 505 and 514 to each other and to electrically conductive pads 508. Solder balls 504 are formed on pads 508. Encapsulant 503 is filled into hole 509 and cavity 513 to encapsulate the integrated circuit chip 501.

The presence of the heat sink 510 in ball grid array 500 provides good heat transfer away from the chip 501, particularly since most of the heat sink surface is exposed to the exterior of the ball grid array 500.

Figure 6:
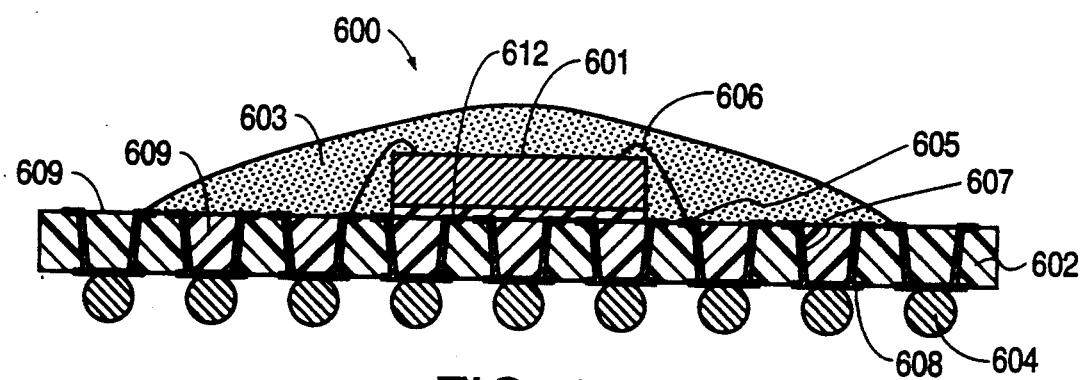
FIG. 6 is a cross-sectional view of a ball grid array according to another embodiment of the invention.

FIG. 6 is a cross-sectional view of a ball grid array 600 according to another embodiment of the invention. Plated vias 607 are formed through the substrate 602. Except for vias 607 near the edge of the substrate 602, vias 607 are filled with an epoxy resin 609. However, this need not be the case, and all vias 607 can be filled with epoxy resin 609. The integrated circuit chip 601 is attached to the substrate 602 with an adhesive 612 such that the chip 601 covers some of the vias 607. Bond pads (not shown) on the chip 601 are electrically connected with bond wires 606 to electrically conductive traces 605 on the substrate 602. The vias 607 electrically connect the traces 605 to electrically conductive pads 608 on which solder balls 604 are formed. An encapsulant 603 is formed over the chip 601 and bond wires 606 by potting.

In the invention, preferably, organic materials (e.g., thermosetting or thermoplastic resins) with organic fiber reinforcement (e.g., aramid fibers) are used to form the substrate layer or layers in ball grid arrays according to the invention. One reason for this preference is that organic substrates are less expensive than inorganic substrates (e.g., glass or ceramic). A second reason is that organic materials may be penetrated with a laser more easily and quickly than inorganic materials. Finally, organic materials have better dielectric properties than inorganic materials.

However, when the substrate layer or layers are formed of organic materials, the use of a thermal laser produces undesirable side effects such as dielectric degradation, charring and surface reflow. Because of these problems, it has been necessary either to use the more expensive ceramic or glass organic substrates if use of a thermal laser is contemplated, or perform mechanical drilling to form the vias in an organic substrate.

In one embodiment according to the invention, the substrate layer or layers are formed of organic material. Vias are formed in the substrate using a non-thermal laser (e.g., an excimer laser), thus avoiding the detrimental effects associated with the use of thermal lasers or mechanical drills.

Any organic material, such as a thermosetting resin or thermoplastic resin, may be used to form the substrate layer or layers. The thermosetting resins are preferably chosen from the following group: epoxy, polyimide, polyamide, polyetherimide or polycyanurate. The thermoplastic resins are preferably chosen from the following group: polyester, polyamide, polysulfone, polyetherimide, polycarbonate. Epoxy resin is most desirable because of its low cost, its ready availability and wide knowledge of its properties. Preferably, an epoxy resin having high temperature resistance is used so that high hole quality is maintained. Epoxy resin with low ionic content (i.e., low impurity levels) is also preferable to avoid corrosion of the integrated circuit chip or chips and to prevent electromigration.

Organic fiber reinforcement may also be used in the organic resin. Fibers that may be used include: aramid, polyester, polyamide, poly-ether-ether-ketone, poly-imide, polyetherimide, or polysulfone. The fibers may include inorganic fillers such as, alumina or silica, as long as the fillers do not impede penetration by the laser. Preferably, aramid fibers are used, such as poly-(paraphenylene terephthalamide) and co-poly-(paraphenylene/3,4'-diphenylether terephthalamide), since these fibers are easily fabricated into substrates. In particular, the latter fiber has higher purity in terms of ionic content.

The fiber reinforcement can be woven fabric, nonwoven fabric or paper. Paper reinforcements may be preferable due to their flat surface which allows easy mounting of integrated circuit chips or passive components.

The region of the top surface of the substrate outside of the area in which the integrated circuit chip is to be attached is patterned and etched to form a conductive interconnection pattern. This may be done either before or after the substrate is constructed as described above. If the conformal mask technique is used, the mask may be left in place after formation of the vias, and the interconnection pattern is formed on the exposed surface of the mask. Interconnection of the conductive interconnection pattern to individual integrated circuit chips and passive components can be done by wirebonding, TAB, flip-chip, or other bonding technologies.

After the multilayer substrate is constructed, vias formed, conductive plating deposited in the vias, interconnection patterns formed, and the integrated circuit chip or chips and passive components attached and electrically connected as previously described, the chips and passive components are then encapsulated with a molding or potting resin such as epoxy, polyimide or poly-bismaleimide resin, to protect the integrated circuit chip or chips and the passive components.

To illustrate the above description of the invention, two examples will be presented of desirable embodiments of the invention.

In the first example, a resin containing an aramid fiber formed of co-poly-(paraphenylene/3,4'-diphenylether terephthalamide), having a diameter of 12 microns and a length of 3 mm, is sheet-formed using a paper machine. The resin contains 15% organic binder from water-soluble epoxy. The basis weight of the paper is 72 g/m$^2$. The paper is impregnated with an epoxy resin including a hardener or a Novolac type resin to form a prepreg. The fiber content of the prepreg is 45% by weight. The prepreg is laminated to form a sheet having a thickness of 0.1 mm. Details of the preparation are described in Japanese Open Patent 1-281791.

Copper foils having a thickness of 18 microns are laminated to both sides of the prepreg using an epoxy adhesive. The total thickness of the insulation layer (including the epoxy adhesive layer) is typically 0.08–0.15 mm. One side of the copper is etched to form holes, and vias are formed with a Kr/F excimer laser using a conformal masking method. The laser has a wavelength of 248 nm. The frequency of the laser beam is 200 Hz and the pulse energy is 1.6 J/cm$^2$. The holes are subjected to an ablation of 7 seconds. The vias are then plated with copper to electrically connect the copper foils. Both sides of copper are pattern-etched to form a substrate. In pattern-etching, the bottom of the vias form round pads. The number of traces is 225.

An integrated circuit chip is adhesively attached to the top of the substrate, and wire-bonded to pads on the top of the substrate which are connected to pads on the bottom of the substrate. A molding resin is molded on the top of the substrate to encapsulate the semiconductive chips and traces. Solder balls are attached to the pads on the bottom of the substrate, and reflow attached at 230° C. The completed ball grid array is mounted on a printed circuit board, and reflow attached at 230° C.

In the second example, the same laminate as in the first example is formed. One side of the laminate is patterned for laser drilling, and laser ablation is applied. After the copper plating is applied, pattern-etching is made to form a "core" substrate. A sheet of prepreg is then stacked and press-cured together with a copper foil on the top. The top copper is then etched, and the top layer is laser-ablated, plated and pattern-etched. Thus, the second layer is also fabricated.

In the same manner, a four-layer substrate is obtained, having pads for flip-chips on the top, and pads for solder balls on the bottom.

Two chips are mounted on the substrate, reflowed to complete flip-chip mounting, encapsulated with a molding resin, and solder balls are attached. Thus, a ball grid array including two chips is formed.

Various embodiments of the invention have been described. The descriptions are intended to be illustrative, and not limitative. Thus, it will be apparent to one skilled in the art that certain modifications may be made to the invention as described without departing from the scope of the claims set out below.

We claim:

1. A packaged integrated circuit, comprising:
    a substrate having first and second opposed surfaces, electrically conductive first traces being formed on the first surface of the substrate;
    a series of electrically conductive pads extending across a portion of the substrate opposite the first surface of the substrate;
    a series of vias formed in the substrate, each via extending to one of said pads;
    electrically conductive plating material on sidewalls of said vias in electrical contact with selected ones of said first traces and with selected ones of said pads;
    an electronic device attached to the first surface of the substrate;
    means for making electrical connection between the electronic device and at least one of the first traces on the substrate; and
    encapsulant formed around the electronic device so as to protect the electronic device, the encapsulant covering at least a portion of the first surface of the substrate, filling said vias and extending against a via-facing surface of said pads.

2. The packaged integrated circuit of claim 1, wherein solder balls are attached to pads at a position juxtaposed to the second surface of the substrate.

3. The packaged integrated circuit of claim 1, wherein said vias are in the form of an inverted truncated cone.

4. The packaged integrated circuit of claim 1, wherein said vias have tapered sidewalls converging toward said pads.

5. The packaged integrated circuit of claim 1, wherein the vias are formed by laser drilling.

6. The packaged integrated circuit of claim 5, wherein the laser is an excimer laser.

7. The packaged integrated circuit of claim 1, wherein electrically non-conductive portions of the substrate are made of organic material.

8. The packaged integrated circuit of claim 7, wherein the organic material includes organic reinforcement fibers.

9. The packaged integrated circuit of claim 8, where the reinforcement fibers are aramid fibers.

10. A method of forming a package integrated circuit comprising the steps of:
    fabricating a substrate having a first surface and an opposed second surface;
    forming a series of electrically conductive first traces on said first surface;
    forming a series of electrically conductive pads extending across a portion of the substrate opposite to said first surface;
    then forming a series of vias through said substrate to a via-facing surface of the pads;
    depositing a conductive plating in said vias and extending from selected ones of said first traces to selected ones of said pads;
    attaching an electronic device to said first surface;
    electrically connecting the electronic device to said first traces; and
    encapsulating the electronic device with an electrically insulating encapsulant so as to protect the electronic device, the encapsulant covering at least part of said first surface, filling said vias and extending against said via-facing surface of said pads.

11. A method as in claim 10, further comprising forming a solder ball on a surface of each of said pads which faces away from the vias.

12. A method as in claim 10, wherein all first traces on the first surface and the plating in said vias are covered by the encapsulant.

13. A method as in claim 10, wherein vias are formed by laser drilling down to said via-facing surface of said pads.

14. A method as in claim 13, wherein the laser drilling is excimer laser drilling.

15. A method as in claim 10, wherein electrically non-conductive portions of the substrate are made of organic material.

16. A method as in claim 15, wherein the organic material includes organic reinforcement fibers.

17. A method as in claim 16, where the reinforcement fibers are aramid fibers.

* * * * *

UNITED STATES PATENT AND TRADEMARK OFFICE
CERTIFICATE OF CORRECTION

PATENT NO.   : 5,355,283
DATED        : October 11, 1994
INVENTOR(S)  : Robert C. Marrs and Tadashi Hirakawa It is certified that error appears in the above-identified patent and that said Letters Patent is hereby corrected as shown below:

In Column 2, line 4, delete "103" and insert --107--.

In Column 2, line 4, delete "107" and insety --103--.

In Column 2, line 54, after "holes" inset --107--.

In Column 5, line 63, delete "to".

In Column 9, line 58, after "to" insert --said--.

Signed and Sealed this

Thirtieth Day of May, 1995

Attest:

BRUCE LEHMAN

*Attesting Officer*         *Commissioner of Patents and Trademarks*